(12) United States Patent
Kimura

(10) Patent No.: US 6,288,445 B1
(45) Date of Patent: Sep. 11, 2001

(54) SEMICONDUCTOR DEVICE

(75) Inventor: Takehiro Kimura, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/366,539

(22) Filed: Aug. 4, 1999

(30) Foreign Application Priority Data

Aug. 4, 1998 (JP) .................................................. 10-220335

(51) Int. Cl.[7] ........................... H01L 23/48; H01L 23/52; H01L 29/40
(52) U.S. Cl. ............................ 257/737; 257/738; 257/778
(58) Field of Search ................................. 257/737, 738, 257/778; 228/180.22

(56) References Cited

U.S. PATENT DOCUMENTS 5,407,864 * 4/1995 Kim .
5,912,507 * 6/1999 Dunn et al. .

FOREIGN PATENT DOCUMENTS

| 1-270239 | 10/1989 | (JP) . |
| 4-363811 | 12/1992 | (JP) . |
| 8-55875 | 2/1996 | (JP) . |

* cited by examiner

Primary Examiner—David E. Graybill
(74) Attorney, Agent, or Firm—Young & Thompson

(57) ABSTRACT

A semiconductor device has a substrate for bumps having a first and a second surface opposite to each other. At least one groove or a plurality of holes are formed at the first surface of the substrate for bumps. A semiconductor chip is mounted on the second surface of the substrate for bumps. The semiconductor chip and the substrate for bumps are bonded by an adhesive. A plurality of bumps are formed on the first surface of the substrate for bumps.

9 Claims, 12 Drawing Sheets

SEMICONDUCTOR DEVICE

BACKGROUND OF THE INVENTION

1. Field of the Invention

The present invention relates to a semiconductor device having a semiconductor chip, and a process for producing the same, and in particular to a semiconductor device having a structure wherein a groove or holes are made in a substrate on which bumps for electrical connection from its back surface are formed, i.e., a substrate for bumps, and/or in an adhesive for bonding the substrate for the bumps to a semiconductor chip, and a process for producing the same.

2. Description of the Related Art

Recently, the number of external terminals in semiconductor devices has increased with an increase in the integration degree thereof. In some cases of semiconductor devices having such a high integration degree, a semiconductor chip is not directly mounted on a substrate but is mounted on a substrate through a substrate for bumps, such as a tape on which solder bumps are formed. FIG. 1A is a plan view illustrating a structure of a semiconductor device in a prior art, and FIG. 1B is a cross section taken on F—F line of FIG. 1A.

As shown in FIGS. 1A and 1B, a semiconductor chip 700 is connected to a tape 400 as a substrate for bumps with an adhesive 600. Electrodes 300a are formed at the external terminal side of the tape 400, and electrodes 300b are formed at the side of the semiconductor chip 700 thereof. Each of the electrodes 300a is connected to each of the electrodes 300b through a wiring circuit arranged inside the tape 400.

Electrodes 300c are formed at the tape 400 side of the semiconductor chip 700. The electrodes 300b are connected to the electrodes 300c through bumps 500. An adhesive agent 600 is injected into the region between the semiconductor chip 700 and the tape 400 after the connection of the electrodes through the bumps 500. Solder balls 200 are formed on the electrodes 300a of the tape 400. This semiconductor device is mounted on a substrate (not shown) through the solder balls 200.

In the semiconductor device having the above-mentioned structure, the area where the solder balls are mounted becomes large if the number of the solder bumps, which are external terminals, increases. Therefore, if the semiconductor device is mounted on the substrate and subsequently stress is generated by a change in temperature, there arises a problem that the solder balls 200 subjected to the stress are broken so as to become open inferiority.

Such stress is generated by the difference in the thermal expansion coefficients between the semiconductor device and the substrate on which the semiconductor device is mounted. When the change in temperature is generated by the operation of the semiconductor device so that its temperature rises, the semiconductor device and the substrate expand. When the temperature falls, the semiconductor and the substrate contract. In these cases, if the thermal expansion coefficients of the substrate and the semiconductor device are different from each other, the degrees of the expansion and contraction are different. In general, the substrate expands and contracts more greatly than the semiconductor device. When such expansion and contraction are repeated many times, stress is structurally concentrated mainly in joint portions of the solder balls 200. For this reason, the solder balls 200 are broken to become open inferiority.

A semiconductor device for overcoming such drawbacks is proposed (Japanese Patent Application Laid-Open No. Hei 8-55875, published on Feb. 27, 1996). FIG. 2 is a cross section illustrating a structure of a semiconductor device, in the prior art, disclosed in the Japanese Patent Application Laid-Open No. Hei 8-55875. FIG. 3 is a plan view illustrating a mounting structure of a semiconductor chip and a package substrate in the semiconductor device illustrated in FIG. 2.

In the semiconductor device disclosed in this publication, a package substrate 410, which is a substrate for bumps and on which a semiconductor chip 710 is mounted, is divided into 4 pieces. The semiconductor chip 710 is mounted on a module substrate 800 through the package substrates 410. The whole of the semiconductor chip 710, including bump electrodes 510, is packaged and fixed by means of a molding resin 610. The four package substrates 410 and the module substrate 800 are connected to each other through bump electrodes 210.

According to the semiconductor device in the prior art, disclosed in the above-mentioned publication, the package substrate, on which the semiconductor chip 710 is mounted is divided into the 4 package substrates 410; therefore, the maximum distance L1 between the bumps is not more than ½ of the maximum distance L0 between the bumps in the case that the package substrate is not divided, as illustrated in FIG. 3. This results in reduction in strain which is applied to the bump electrodes 510 by a change in temperature.

However, even if the package substrate is composed of the 4 divided package substrates 410, regions between the package substrates 410 are embedded by the molding resin 610. Accordingly, these are substantially integrated with each other. For this reason, the stress based in the change in temperature is transmitted through the molding resin 610 by which the regions between the 4 package substrates 410 are embedded, so that the strain applied to the bump electrodes 510 is not sufficiently reduced.

According to the above-mentioned publication, no consideration is given to the reduction in the stress based on the temperature-change between the package substrates 410 and the module substrate 800.

In order to mount the semiconductor chip 710 on the 4 package substrates 410 resulting from the division, the following steps are necessary: the step of positioning the 4 package substrates 410 to each other at a given interval, the step of mounting the semiconductor device 710 under the condition that the distance between the respective package substrates 410 is kept and fixed, and the step of packaging the semiconductor device 710 by means of the molding resin 610. However, it is very difficult to position the divided package substrates to each other. Moreover, there remains a problem that the mounting requires much time since the number of the steps increases.

SUMMARY OF THE INVENTION

An object of the present invention is to provide a semiconductor device, having a semiconductor chip and a substrate for bumps (i.e., bump-substrate), making it possible to disperse easily stress based on the difference in thermal expansion coefficients between them and a substrate on which they are to be mounted; and a process for producing the same.

According to one aspect of the present invention, a semiconductor device may comprise a substrate for bumps having a first and a second surfaces. The substrate for bumps may have at least one groove or a plurality of holes formed at the first surface. The semiconductor device may comprise a semiconductor chip mounted on the second surface of the substrate for bumps, an adhesive which bonds the semiconductor chip and the substrate for bumps, and a plurality of bumps formed on the first surface of the substrate for bumps.

According to one aspect of the present invention, the groove or the holes are made in the first surface; therefore, the groove or the holes make it possible to relieve the stress concentrically generated in the bumps of the substrate for bumps by temperature-change after the semiconductor device is mounted on a substrate. Therefore, it is possible to relieve the stress applied to the joint portions of the bumps by temperature-change after the semiconductor device is mounted on the substrate such as a printed wiring board, and prolong the lifetime of the joint portions of the bumps. As a result, the reliability of the semiconductor device can be improved.

In the present invention, the substrate for bumps may be defined into a plurality of areas by the groove. In this case, the stress can be relieved more effectively as the number of the defined areas is larger.

The substrate for bumps may comprise a wiring circuit connecting electrodes of the semiconductor chip and the bumps, and the groove or the holes may be formed at the position not overlapping the wiring circuit. In this case, the groove or the holes may have various shapes such as a circular or slender shape.

The groove or the holes may be formed through the substrate for bumps entirely, or may be formed through the substrate for bumps entirely to reach the middle of the adhesive in the depth direction thereof. Furthermore, the groove or the holes may be formed through the substrate for bumps and the adhesive entirely.

The semiconductor device may comprise a connecting member connecting the electrodes of the semiconductor chip and the substrate for bumps, the connecting member being arranged inside the adhesive.

According to one aspect of the present invention, a process for producing a semiconductor device may comprise the steps of forming a first bump on an electrode of a semiconductor chip; and depositing an adhesive on a first surface of a substrate for bumps. The substrate for bumps may have a first electrode arranged on the first surface and to be connected to the first bump and a second electrode arranged on a second surface opposite to the first surface. This process for producing the semiconductor device may also comprise the steps of making a groove inside the substrate for bumps; bonding the semiconductor chip and the substrate for bumps to each other with the adhesive while connecting the first electrode and the first bump to each other; and forming a second bump on the second electrode.

This process may further comprise the step of removing an unnecessary portion present at the edge of the substrate for bumps.

The step of making the groove may comprise the step of stamping a predetermined area of the substrate for bumps, or the step of cutting a predetermined area of the substrate for bumps.

The process for producing the semiconductor may comprise the step of making a groove in the adhesive as a subsequent step of the step of making the groove inside the substrate for bumps.

According to the present invention, the groove is made inside the substrate for bumps; therefore, the substrate for bumps is not divided before the semiconductor chip is bonded to the substrate for bumps. Accordingly, it is unnecessary that 4 divided substrates are divided to each other and a semiconductor chip is bonded to them as in the prior art. By this, only one is the number of the positioning operation at the time of bonding the semiconductor device to the substrate for bumps. Thus, producing steps and costs can be reduced.

DESCRIPTION OF THE PREFERRED EMBODIMENTS

Figure 4A:
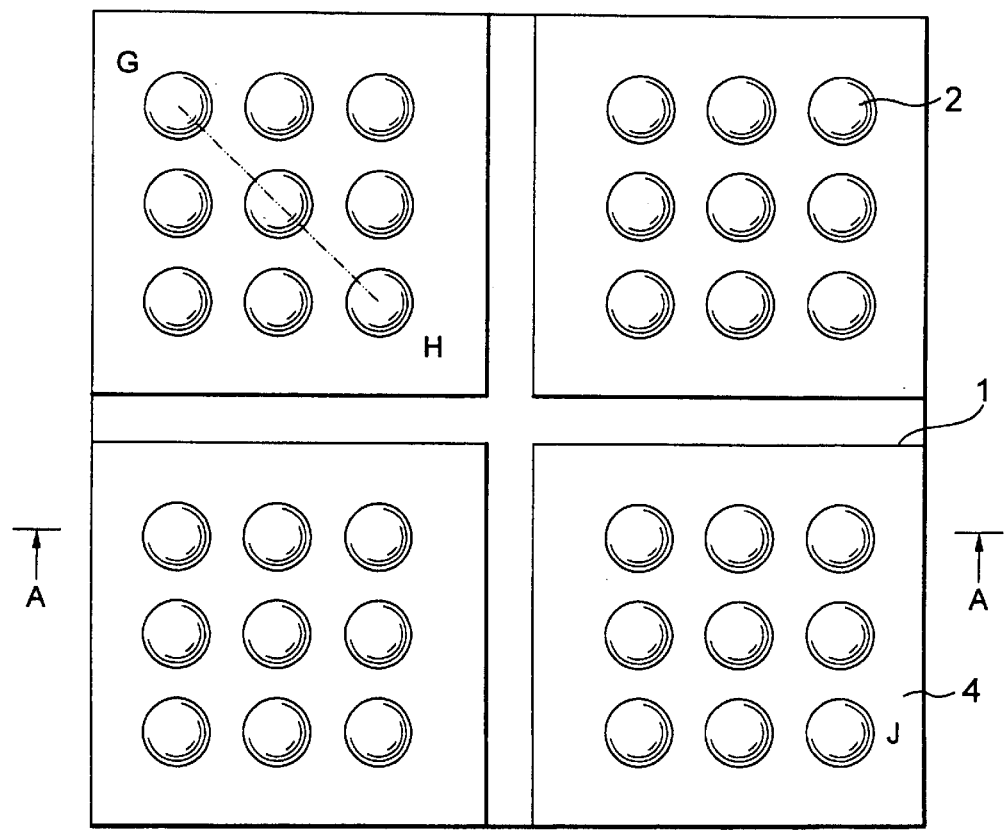
FIG. 4A is a plan view illustrating a structure of a semiconductor device according to a first embodiment of the present invention.

Referring to the attached drawings, semiconductor devices according to embodiments of the present invention will be specifically described hereinafter. FIG. 4A is a plan view illustrating a structure of a semiconductor device according to a first embodiment of the present invention, and FIG. 4B is a cross section taken on A—A line of FIG. 4A.

Figure 4B:
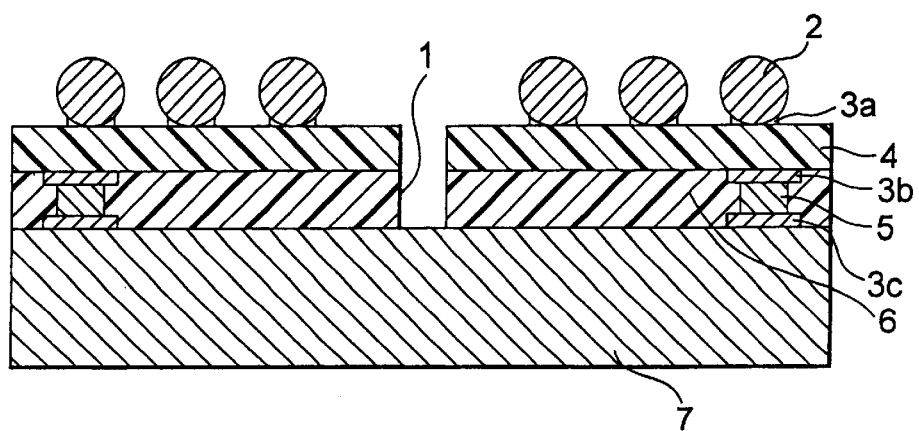
FIG. 4B is a cross section taken on A—A line of FIG. 4A.

As shown in FIGS. 4A and 4B, in the first embodiment, a semiconductor chip 7 and a tape (flexible tape substrate) 4, which is a substrate for bumps, are connected to each other through an adhesive 6. A cross-shaped groove 1 is made in the tape 4 and the adhesive 6. The tape 4 and the adhesive 6 are divided into four parts by means of the groove 1. Plural electrodes 3a are formed at the external terminal side of the tape 4, and a plurality of electrodes 3b are formed at the semiconductor chip 7 side of the tape 4. Each of the electrodes 3a and each of the electrodes 3b are connected to each other through a wiring circuit (not shown) arranged inside the tape 4.

Electrodes 3c are formed at the tape 4 side of the semiconductor chip 7. Each of the electrodes 3c of the semiconductor chip 7 and each of the electrodes 3b of the tape 4 are connected to each other through a Au bump (connecting member) 5. Solder balls 2 are formed on the electrodes 3a of the tape 4. The semiconductor device of the present embodiment having such a structure is mounted on a substrate (not shown) through the solder balls 2.

The adhesive 6 is preferably an adhesive which is not an injecting and hardening type. The adhesive 6 and is, for example, a tape-sticking type. The adhesive 6 is, for example, an adhesive stuck on the tape 4 before connecting the electrodes 3c of the semiconductor chip 7 to the electrodes 3b of the tape 4 through the Au bumps 5. The thickness of the adhesive 6 is set up to a slightly higher value than a height when the connection of the electrodes 3b to the electrodes 3c through the Au bumps 2 finishes.

The characteristic portion of the embodiment is the groove 1 for dividing the adhesive 6 and the tape 4 into four parts. As described above, the groove 1 penetrates the layers of the adhesive 6 and the tape 4, and is made into a cross form, when viewed from the side of the solder balls. The groove 1 is formed at the position where the groove 1 does not cut the wiring circuit inside the tape 4 and does not overlap the Au bumps 5.

The width of the groove 1 is, for example, 10 $\mu$m or more. The width varies dependently on the size of the semiconductor chip 7, the pitch of the solder balls 2 as external terminals, the position of the Au bumps 5, the wiring pattern of the tape 4, and the like. It is especially preferred that the width is from about 100 to about 500 $\mu$m. The depth of the groove 1 varies dependently on the thickness of the tape 4, the thickness of the electrodes 3b and 3c and the thickness of the Au bumps 5a. It is desired that the depth ranges from about 30 to about 2000 $\mu$m. In the embodiment, the depth of the groove 1 is 100 $\mu$m.

According to the first embodiment having the above-mentioned structure, stress generated by temperature-change after the device is mounted on a substrate (not shown) is relieved since the groove 1 is made in the tape 4 and the adhesive 6. As described above, this stress is generated by the difference in the thermal expansion coefficients between the substrate (not shown) and the semiconductor device. That is, the temperature-change is generated by the operation of the semiconductor device; the semiconductor device and the substrate expand when temperature rises while they contract when temperature falls. In these cases, if the thermal expansion coefficients of the substrate and the semiconductor device are different from each other, the degrees of expansion and contract thereof are different. As described above, in general the substrate expands and contracts more greatly than the semiconductor device. If such expansion and contraction are repeated many times, stress structurally concentrates mainly in the joint portions between the solder balls 2 and the substrate. The intensity of the stress is decided by the thermal expansion coefficients of materials of the semiconductor device and the substrate, and the distance between the substrate and the semiconductor device, which depends on the diameter of the solder balls 2.

Figure 1A:
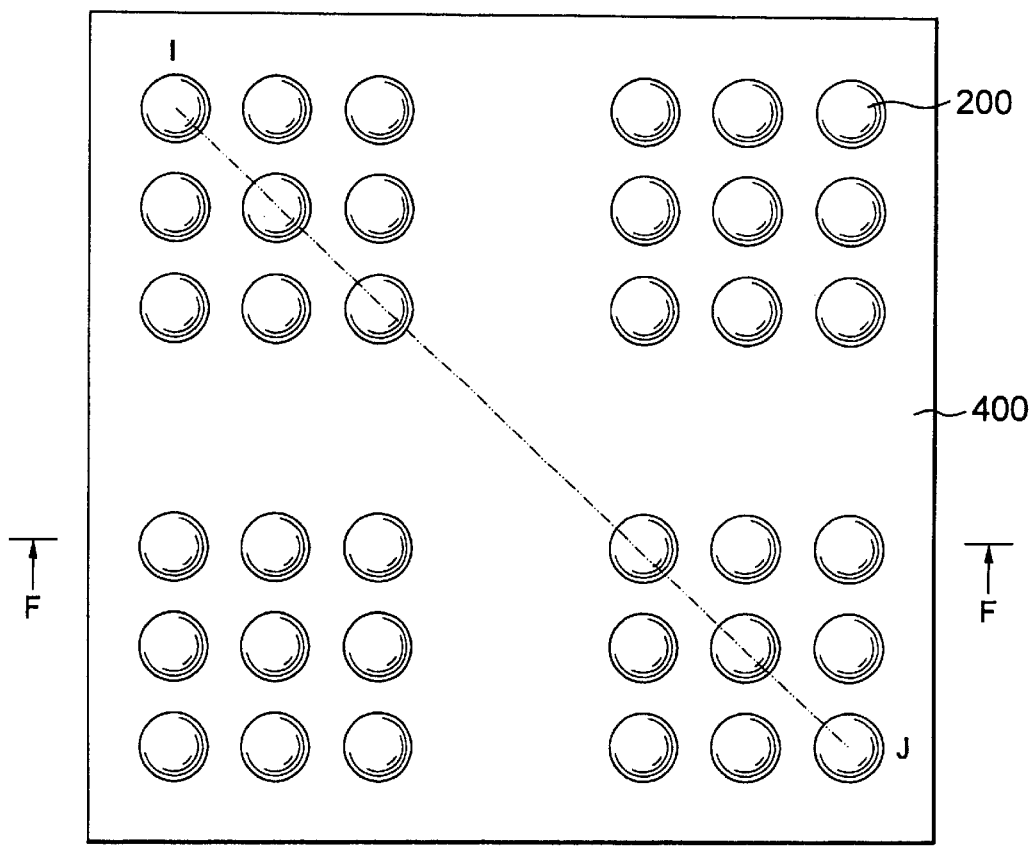
FIG. 1A is a plan view illustrating a structure of a semiconductor device in a prior art.
Figure 1B:
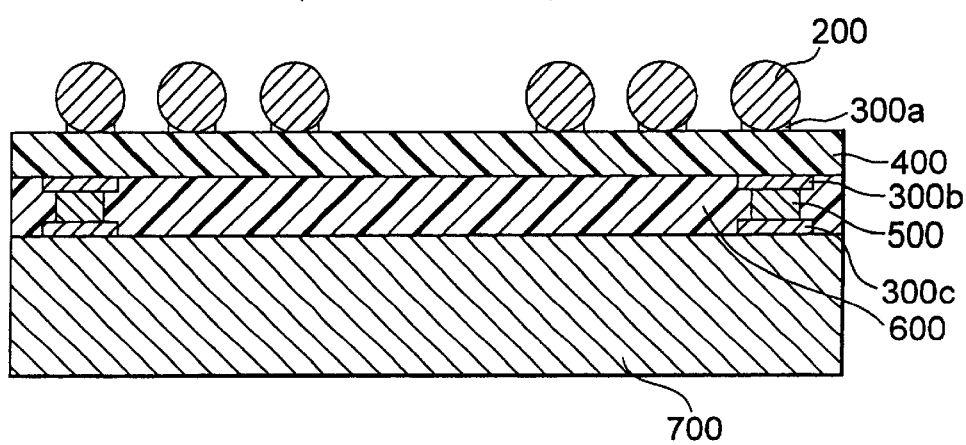
FIG. 1B is a cross section taken on F—F line of FIG. 1A.
Figure 2:
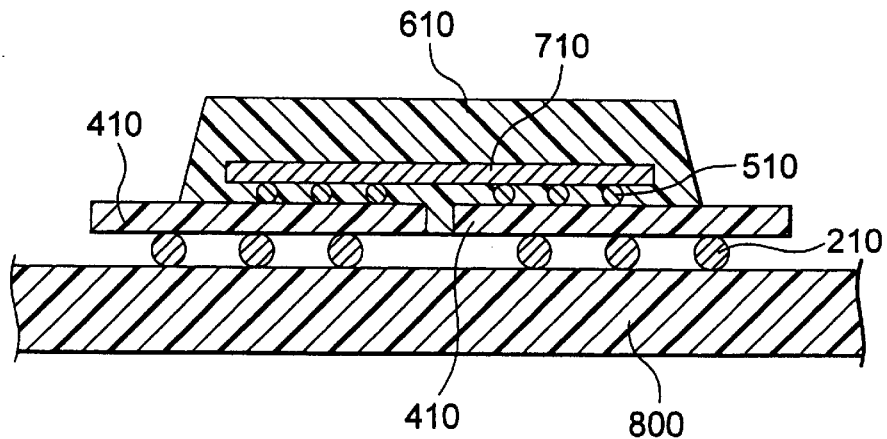
FIG. 2 is a cross section illustrating a structure of a semiconductor device in a prior art, disclosed in Japanese Patent Application Laid-Open No. Hei 8-55875.
Figure 3:
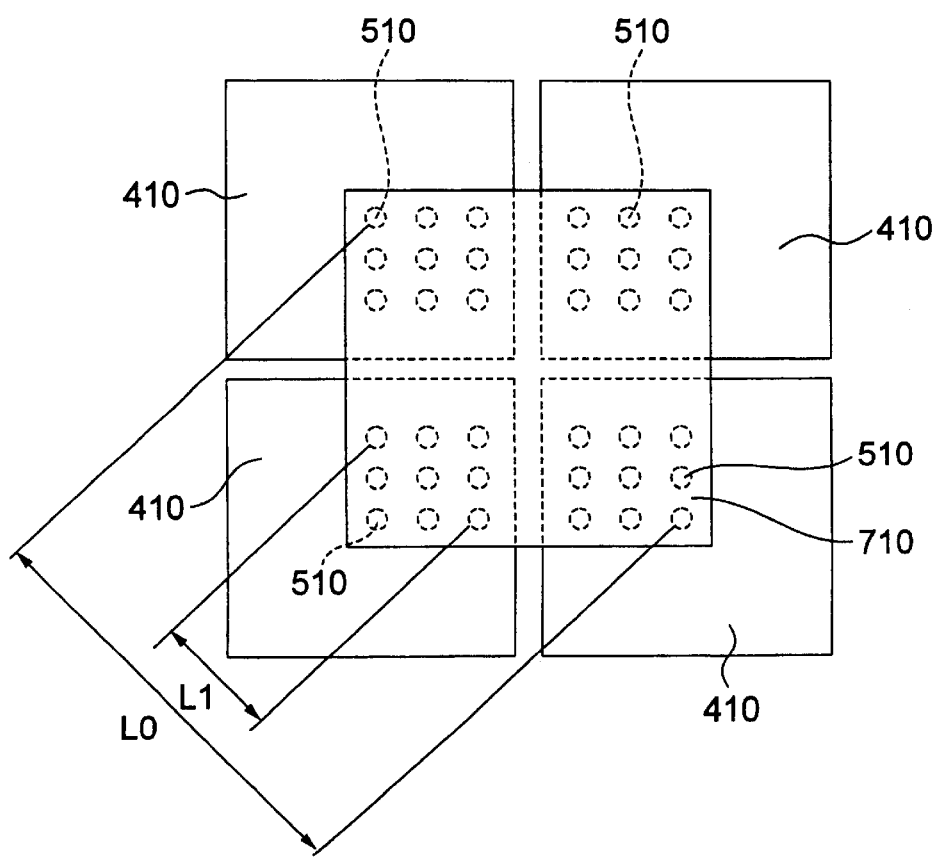
FIG. 3 is a plan view illustrating the mounting structure of a semiconductor chip and a package substrate in the semiconductor device shown in FIG. 2.

In the case of the semiconductor device of the first embodiment, shown in FIG. 4A, the distance between G and H, which is a mounting distance of the solder balls 2, is not more than ½of the distance between I and J, which is a mounting distance of the conventional semiconductor device which has no groove and is shown in FIG. 1A. Therefore, the stress applied to the solder balls 2 is reduced accordingly.

In this way, according to the semiconductor device of the first embodiment, the stress based on temperature-change can be relieved. As a result, the reliability of the connection is improved.

Figure 5:
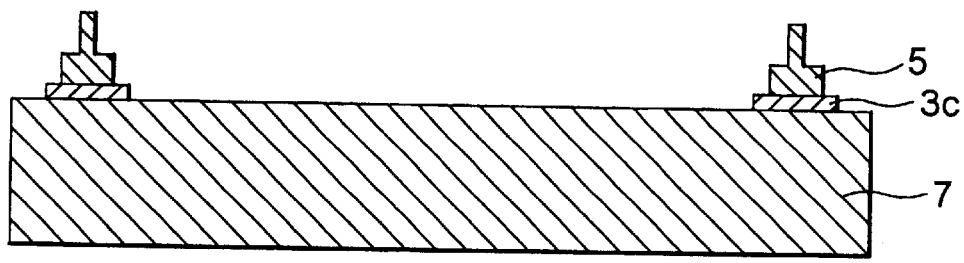
FIG. 5 is a cross section illustrating a process for producing the semiconductor device according to the embodiment of the present invention.
Figure 6A:
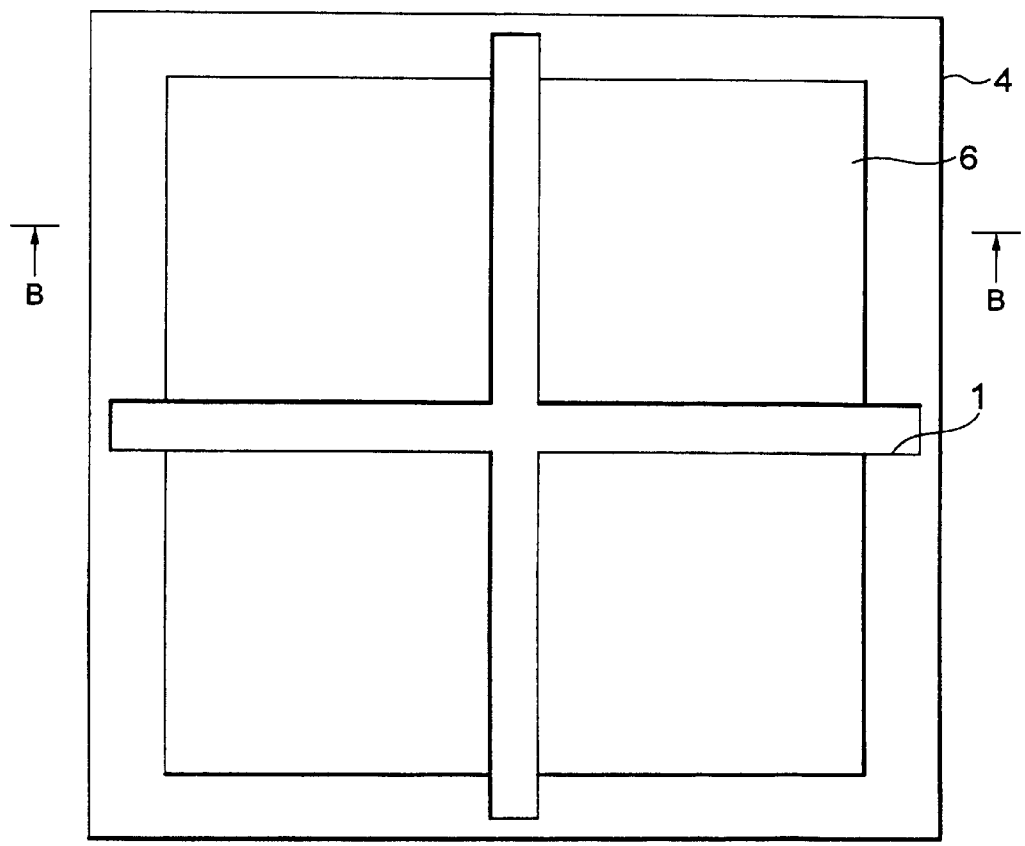
FIG. 6A is a plan view illustrating a step next to the step illustrated in FIG. 5.
Figure 6B:
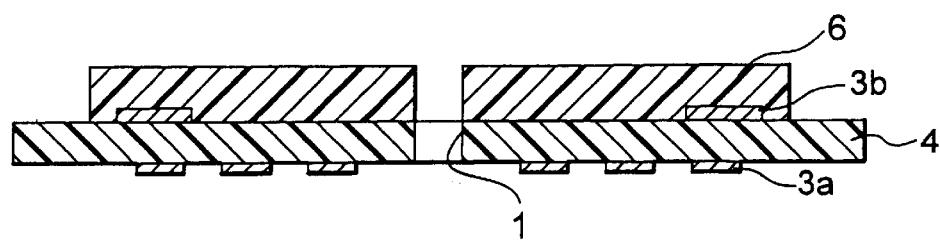
FIG. 6B is a cross section taken on B—B line of FIG. 6A.
Figure 7:
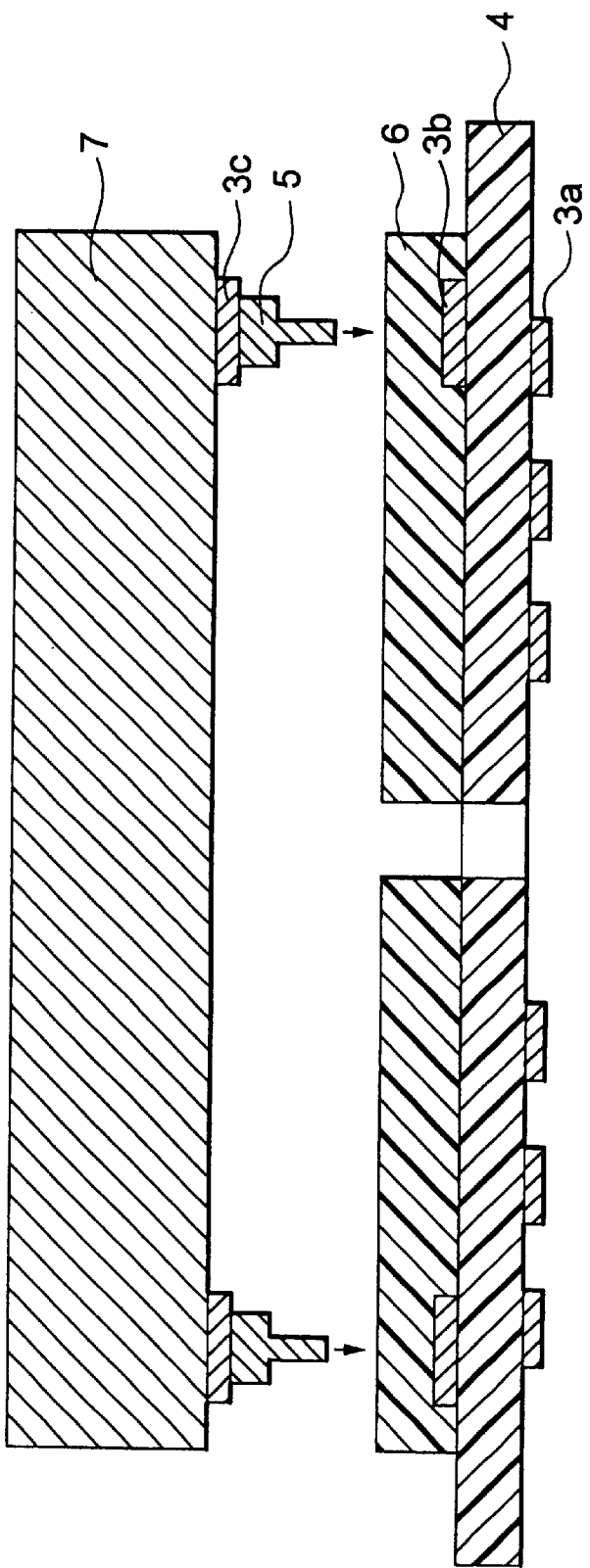
FIG. 7 is a cross section illustrating a step next to the step illustrated in FIGS. 6A and 6B.
Figure 8:
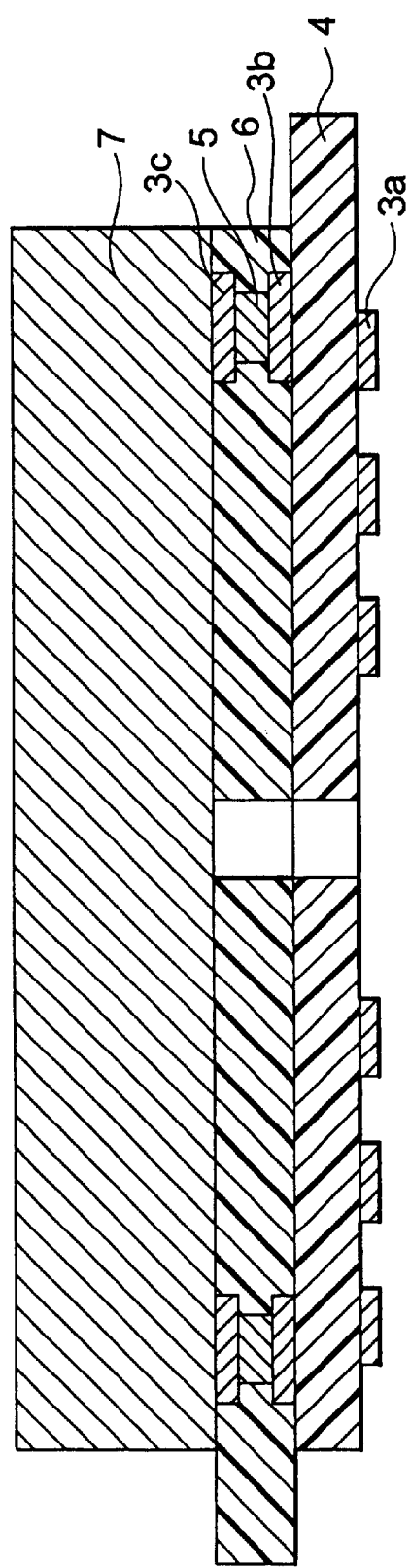
FIG. 8 is a cross section illustrating a step next to the step illustrated in FIG. 7.
Figure 9:
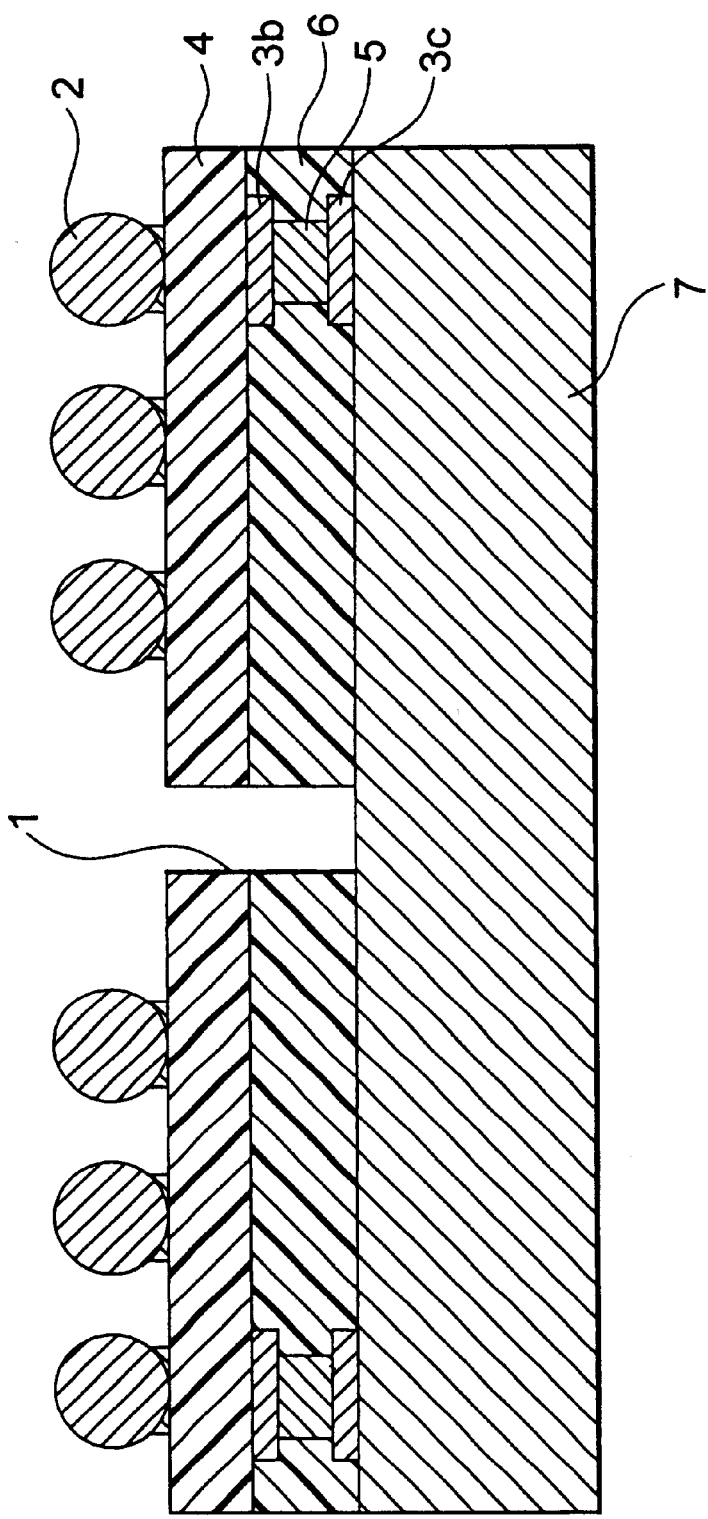
FIG. 9 is a cross section illustrating a step next to the step illustrated in FIG. 8.

The following will describe a process for producing the semiconductor device as described above. FIG. 5 is a cross section illustrating a process for producing the semiconductor device according to the embodiment of the present invention. FIG. 6A is a plan view illustrating a step next to the step illustrated in FIG. 5, and FIG. 6B is a cross section taken on B—B line of FIG. 6A. FIG. 7 is a cross section illustrating a step next to the step illustrated in FIGS. 6A and 6B. FIG. 8 is a cross section illustrating a step next to the step illustrated in FIG. 7. FIG. 9 is a cross section illustrating a step next to the step illustrated in FIG. 8.

As shown in FIG. 5, the Au bumps 5b are first formed on the electrodes 3c of the semiconductor chip 7 by the ball bump process. The Au bumps 5b have, for example, such a shape that its tip is narrower than its base portion at the electrode 3c side, or that its tip becomes sharp.

Next, as shown in FIGS. 6A and 6B, the adhesive 6 is stuck on the electrode 3b side surface of the tape 4 having, on both the surfaces thereof, the electrode 3a and 3b, respectively. Inner wiring (not shown) connected to the electrodes 3a and 3b is formed inside the tape 4. The adhesive 6 may be in a semi-solid form. Subsequently, the tape 4 and the adhesive 6 are stamped out by using a cross-shaped mold, to form the groove 1 extending out of the adhesive 6. The tape 4 is not completely separated by means of the groove 1, and is continues. That is, the tape 4 is not separated at each of the end portions of the groove 1. The groove 1 is formed at the position where the groove 1 never cuts the inner wiring inside the tape 4 and neither overlaps the electrodes 3a nor 3b.

Next, as shown in FIG. 7, the semiconductor chip 7, on which the Au bumps 5 are formed, is faced down to the adhesive side surface of the tape 4, to make the position of the Au bumps 5 consistent with the position of the electrodes 3b of the tape 4.

Next, as shown in FIG. 8, the Au bumps 5 are caused to pierce the adhesive 6 in the semi-solid form, and the Au bumps 5 are pushed onto the electrodes 3b of the tape 4, to make the shape of the Au bumps 5 into a columnar shape, for example. Thereafter, the whole is heated. The pressure for pressing the Au bumps 5 onto the electrodes 3b at this time is preferably from about 1 to about 200 g and more preferably from 15 to 125 g per electrode. The heating temperature varies dependently on the kind of the material of the adhesive 6, but is preferably from 70 to 400° C., and more preferably from 150 to 300° C. The heating time is preferably from 1 to 180 seconds, and more preferably from 3 to 30 seconds.

Figure 10:
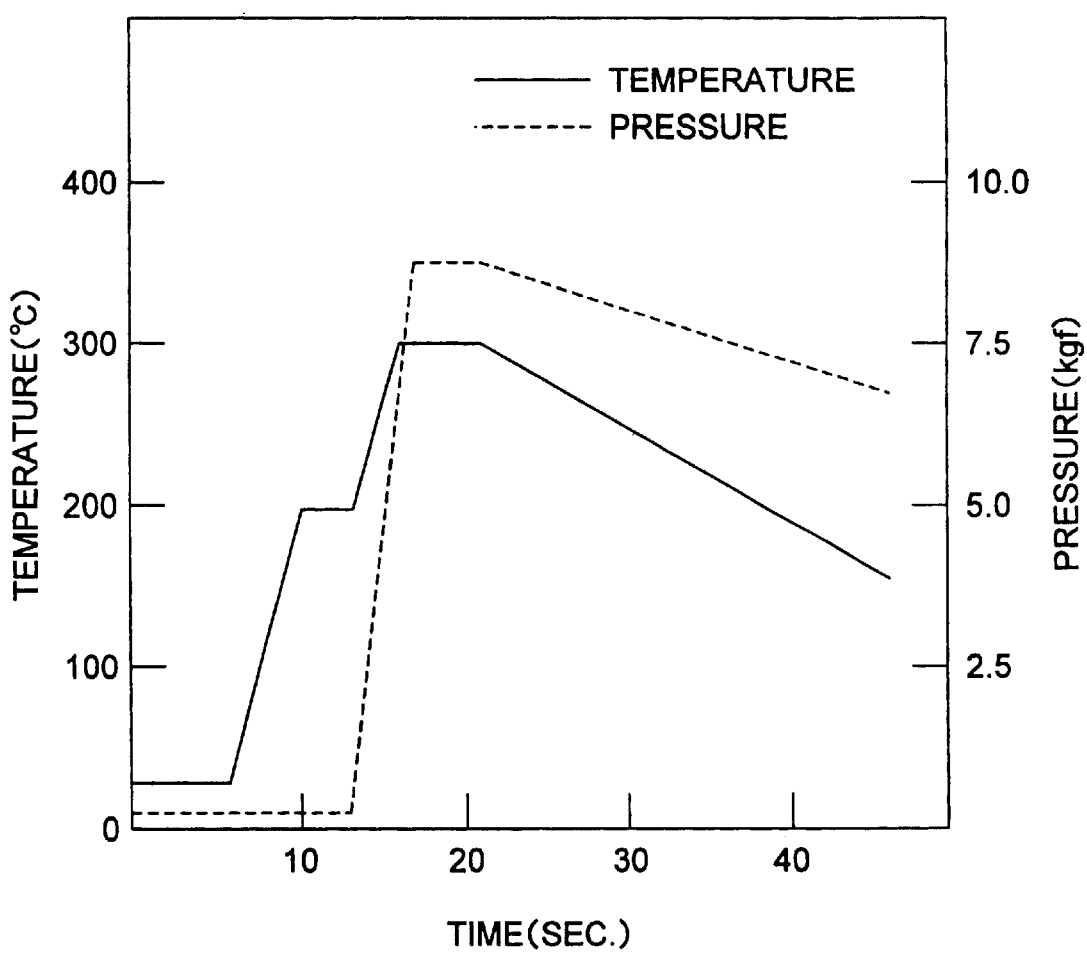
FIG. 10 is a graph showing the relationship between time and temperature, and the relationship between the time and pressure.

FIG. 10 is a graph wherein its horizontal axis represents time, and its vertical axes represent temperature and pressure, and is a graph which shows the relationship about them at the time of the pressing. In FIG. 10, a solid line shows the relationship between temperature and time, and a dot line shows the relationship between the time and pressure. As shown in FIG. 10, for example, heat is first applied and subsequently pressure is applied.

As shown in FIG. 9, thereafter, the solder balls 2 are formed on the electrodes 3a of the tape 4 and excessive portions of the tape 4 and the edge portions of the pushed-out adhesive 6 are cut to complete the semiconductor device.

According to the above-mentioned producing process, when the groove 1 is formed, the tape 4 is not completely divided as shown in FIGS. 6A and 6B and the areas defined by the groove 1 are connected to each other. Therefore, it is unnecessary that, as in the prior art, 4-divided substrates are positioned to each other and jointed to a semiconductor chip. For this reason, in the jointing step shown in FIG. 7, the number of the positioning operation of the tape 4 and the semiconductor chip 7 is only one. Thus, producing steps and producing costs are reduced.

In the process for producing the semiconductor device of the first embodiment, the method for making the groove 1 is not limited to the stamping-out by using the cross-shaped mold. The groove 1 may be made into a cross shape with a cutter, a bite or the like, or may be made with a laser beam. In the first embodiment, in order to define the tape 4 into four parts, the groove 1 is made up to a cross shape. However, a groove for defining the tape 4 into two or more parts may be used.

In the above-mentioned process, the tape 4 is first stuck onto the adhesive 6 and the groove 1 is made with the mold. However, the semiconductor chip 7 and the tape 4 are first pressed onto each other and subsequently a sealing resin instead of the adhesive is poured into the region between them. The groove 1 may then be formed by cutting or the like.

In the first embodiment, as shown in FIGS. 4A and 4B, the groove 1 pierces the tape 4 and the adhesive 6 completely. However, the groove 1 may merely reach the middle of the adhesive 6. The number of the groove(s) 1 may be one or plural.

The Au bumps 5 may be formed by not only the ball bonding method but also other methods such as vapor deposition or plating.

The tape 4 used as the substrate for the bumps is not limited to the flexible tape substrate, and the material thereof is not especially limited. The substrate for the bumps may be, for example, an organic substrate such as a single-side substrate, both-side substrate, multilayer substrate or built-up substrate using FR-4 or FR-5, or a ceramic substrate made of, e.g., alumina, glass ceramic or the like.

Figure 11A:
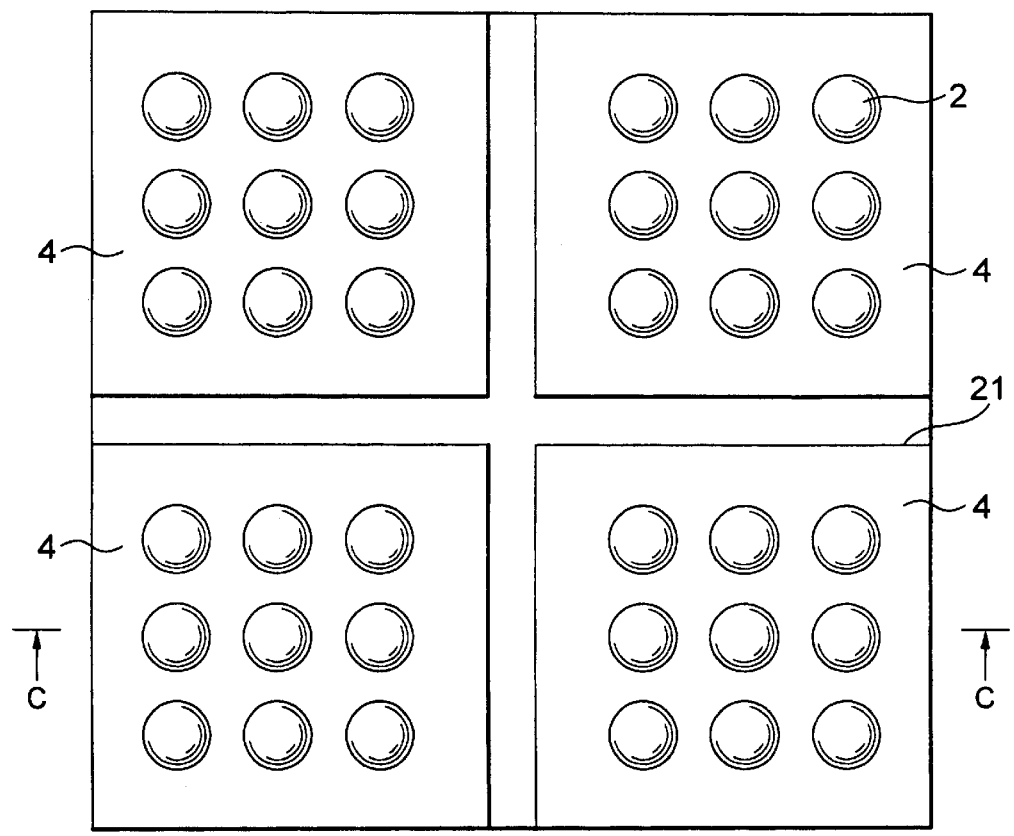
FIG. 11A is a plan view illustrating a structure of a semiconductor device according to a second embodiment of the present invention.
Figure 11B:
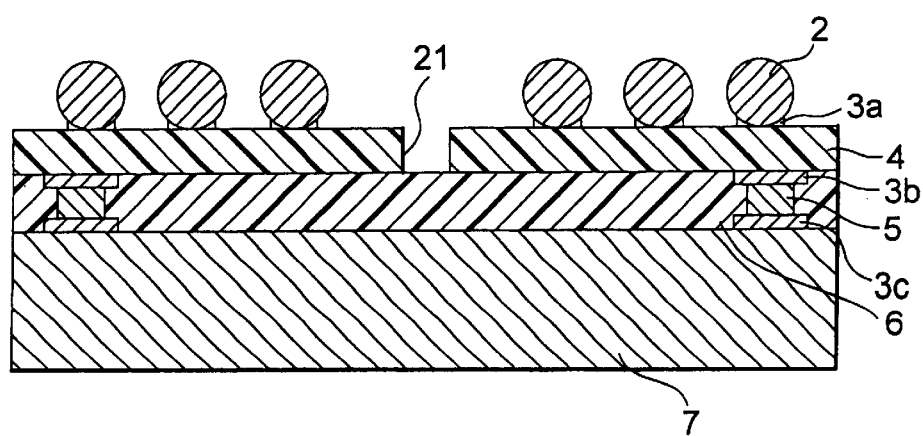
FIG. 11B is a cross section taken on C—C line of FIG. 11A.

The following will describe a second embodiment of the present invention. In the second embodiment, a groove is not made in an adhesive but is made only in a tape. FIG. 11A is a plan view illustrating a structure of a semiconductor device according to a second embodiment of the present invention, and FIG. 11B is a cross section taken on C—C line of FIG. 11A. In the second embodiment illustrated in FIGS. 11A and 11B, the same reference numerals as in FIGS. 4A and 4B are attached to the same elements as in the first embodiment illustrated in FIGS. 4A and 4B. Thus, detailed explanation thereof is omitted.

The second embodiment is different from the first embodiment in depth of their grooves. That is, a cross-shaped groove 21 is made in the tape 4 but is not made in the adhesive 6.

For this reason, the area which is matched with the groove 21 of the semiconductor chip 7 is not exposed to the outside. Thus, the area is protected by the tape 4.

The groove 21 is made, for example, by shaving the tape 4 from the solder bumps 2 side thereof with a cutting device such as a cutter.

Figure 12A:
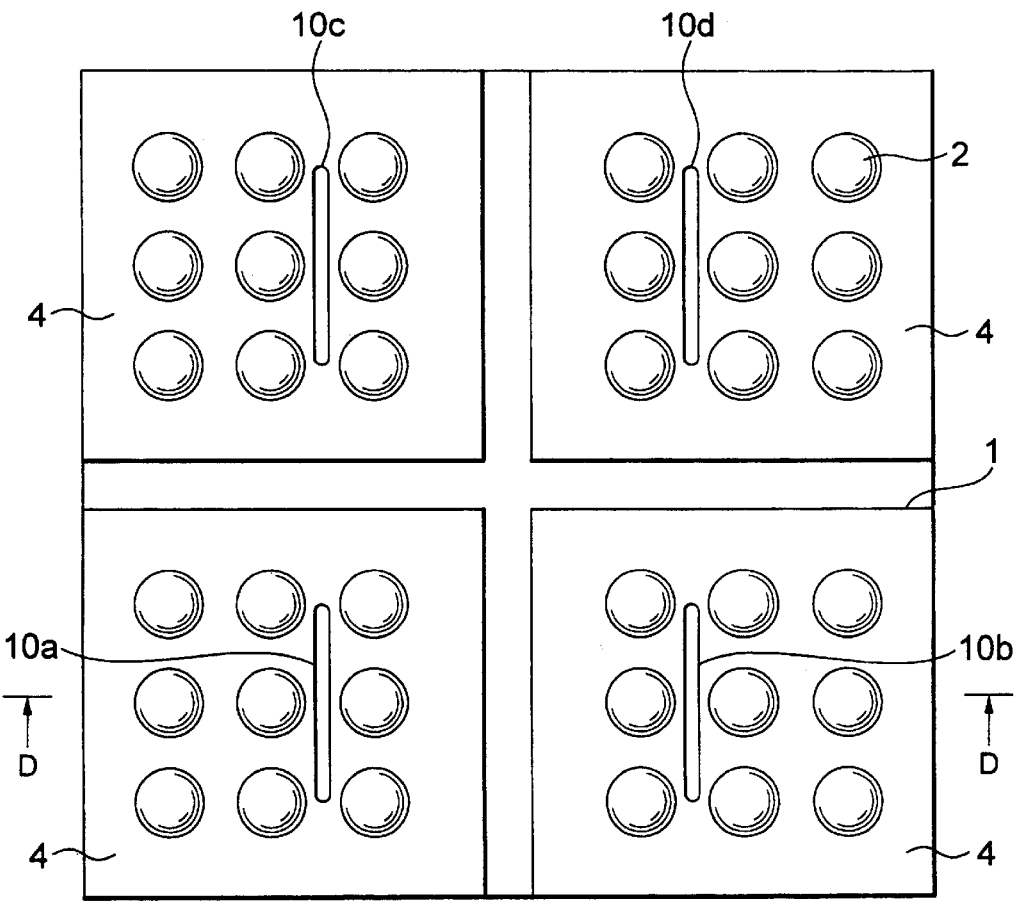
FIG. 12A is a plan view illustrating a structure of a semiconductor device according to a third embodiment of the present invention.
Figure 12B:
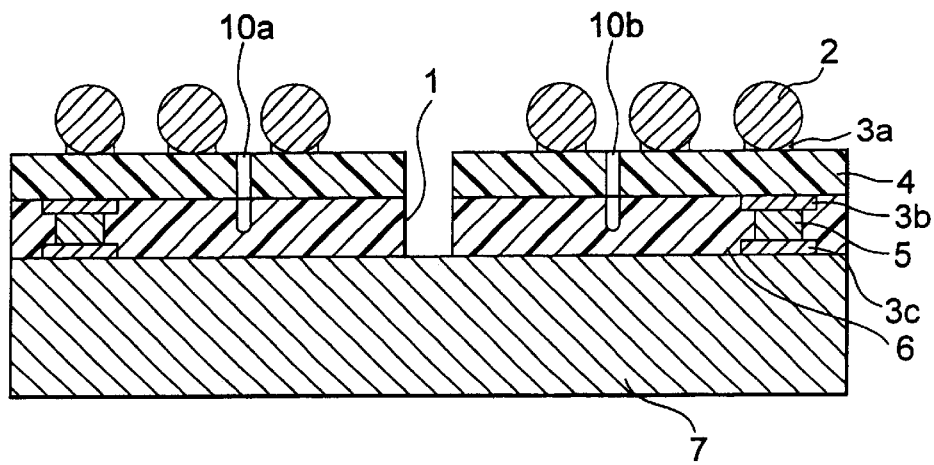
FIG. 12B is a cross section taken on D—D line of FIG. 12A.

The following will describe a third embodiment of the present invention. According to the third embodiment, in each of the areas defined by a cross-shaped groove, a smaller groove is made. FIG. 12A is a plan view illustrating a structure of a semiconductor device according to the third embodiment of the present invention, and FIG. 12B is a cross section taken on D—D line of FIG. 12A. In the third embodiment illustrated in FIGS. 12A and 12B, the same reference numerals as in FIGS. 4A and 4B are attached to the same elements as in the first embodiment illustrated in FIGS. 4A and 4B. Thus, detailed explanation thereof is omitted.

In the third embodiment, each of slender grooves 10a, 10b, 10c and 10d are made in each of 4 areas defined by the cross-shaped groove 1. The width of the slender grooves 10a, 10b, 10c and 10d are, for example, smaller than that of the groove 1. The slender grooves 10a, 10b, 10c and 10d are made at the position where they do not cut the wiring circuit inside the tape 4 and they neither overlap the electrodes 3a nor 3b. The slender grooves 10a, 10b, 10c and 10d reach the middle of the adhesive 6 from the surface of the tape 4. The slender grooves 10a, 10b, 10c and 10d are provided between the solder balls 2.

According to the third embodiment, having such a structure above, the influence by the stress based on heat is reduced still more since the number of the grooves is larger than the number thereof in the first embodiment.

Figure 13A:
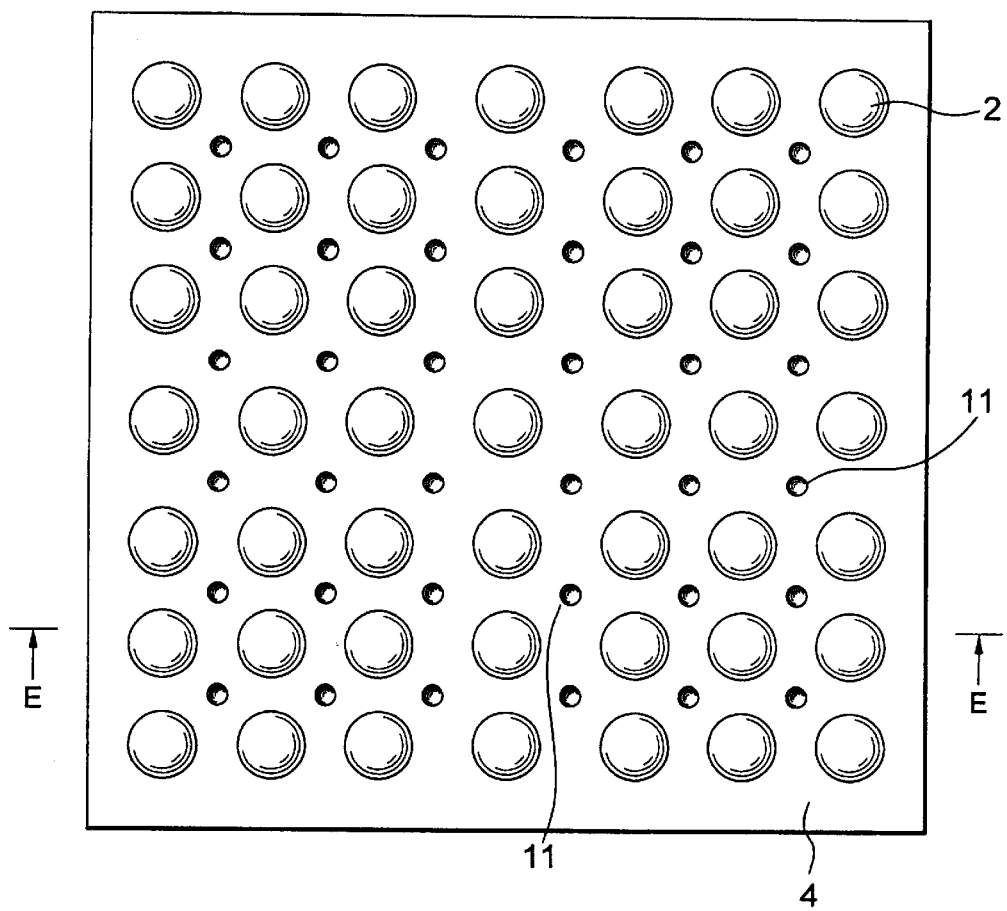
FIG. 13A is a plan view illustrating a structure of a semiconductor device according to a fourth embodiment of the present invention.
Figure 13B:
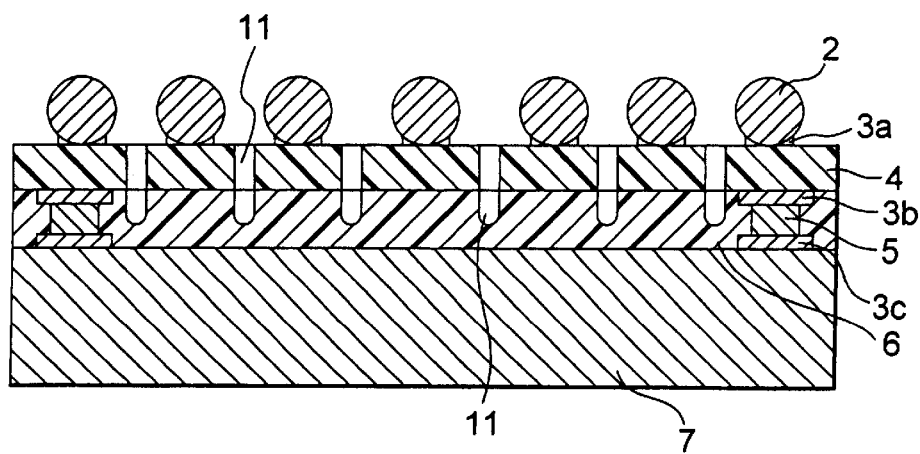
FIG. 13B is a cross section taken on E—E line of FIG. 13A.

The following will describe a fourth embodiment of the present invention. In the fourth embodiment, any linear groove is not made, but a plurality of holes are made. FIG. 13A is a plan view illustrating a structure of a semiconductor device according to the fourth embodiment of the present invention, and FIG. 13B is a cross section taken on E—E line of FIG. 13A. In the fourth embodiment illustrated in FIGS. 13A and 13B, the same reference numerals as in FIGS. 4A and 4B are attached to the same elements as in the first embodiment illustrated in FIGS. 4A and 4B. Thus, detailed explanation thereof is omitted.

In the fourth embodiment, grooves are neither made in the tape 4 nor the adhesive 6. Plural holes, the sectional shape of which is a circle, are dispersed and provided between the solder balls 2. The holes 11 reach the middle of the adhesive 6 from the surface of the tape 4. The holes 11 are made at the position where they do not cut the wiring circuit inside the tape 4 and they neither overlap the electrodes 3a nor 3b.

According to the fourth embodiment having the above-mentioned structure, the stress applied to the joint portions between the respective solder balls 2 and a substrate (not shown) is dispersed by means of the holes 11 provided around the respective solder balls 2.

The number of the holes 11 is not especially limited, but is preferably larger. The method for making the holes 11 is not limited. The holes 11 may be made, for example, by a method of pushing a mold having a number of needles onto the tape 4 or a method of using a laser beam.

The present invention is not limited to the above-mentioned embodiments. For example, the slender grooves 10a to 10d in the third embodiment, as well as the holes 11 in the fourth embodiment, may be made in only the tape 4. The shape of the grooves and holes is not limited to a linear or circular shape and may be, for example, a star-like shape.

As an adhesive, a sticking type material is used but a pouring type resin may be used. In this case, the pouring type resin is pored into the region between the semiconductor chip 7 and the tape 4 at the stage of bonding the semiconductor chip 7 to the tape 4.

What is claimed is:

1. A semiconductor device, comprising:
a substrate for bumps, said substrate for bumps having first and second surfaces opposite to each other and at least one unfilled groove formed at said first surface,
a semiconductor chip mounted on said second surface of said substrate for bumps,
a non-hardening adhesive which bonds said semiconductor chip and said substrate for bumps, and
a plurality of bumps formed on said first surface of said substrate for bumps.

2. The semiconductor device according to claim 1, wherein said substrate for bumps is defined into a plurality of areas by said groove and said semiconductor chip has an area defined by an exterior chip perimeter which is at least as great as an area of said substrate for bumps as defined by an exterior substrate perimeter.

3. The semiconductor device according to claim 1, wherein said substrate for bumps having a wiring circuit connecting electrodes of said semiconductor chip and said bumps, and said groove is formed at the position not overlapping said wiring circuit.

4. The semiconductor device according to claim 1, wherein said groove is formed through said substrate for bumps entirely.

5. The semiconductor device according to claim 1, wherein said groove is formed entirely through said substrate for bumps and only partially through said adhesive, said groove ending at the middle of said adhesive in the depth direction thereof.

6. The semiconductor device according to claim 1, wherein said groove is formed through said substrate for bumps and said adhesive entirely such that said groove exposes a surface of said semiconductor chip.

7. The semiconductor device according to claim 1, which further comprising a connecting member connecting electrodes of said semiconductor chip and said substrate for bumps, said connecting member being arranged inside said adhesive.

8. The semiconductor device of claim 1, wherein. the substrate for bumps is a flexible tape substrate and said adhesive is limited to region intermediate said substrate for bumps and said semiconductor chip.

9. The semiconductor device of claim 1, wherein the groove is in the form of an elongated slit extending completely through said substrate for bumps.

* * * * *